United States Patent [19]

Shirasawa et al.

[11] Patent Number: 4,614,559
[45] Date of Patent: Sep. 30, 1986

[54] METHOD OF FABRICATING MULTILAYER PRINTED-CIRCUIT BOARD

[75] Inventors: Hisato Shirasawa; Norio Sengoku; Nobuaki Ohki, all of Hadano, Japan

[73] Assignee: Hitachi, Ltd., Tokyo, Japan

[21] Appl. No.: 684,791

[22] Filed: Dec. 21, 1984

[30] Foreign Application Priority Data

Dec. 23, 1983 [JP] Japan ................................ 58-241918

[51] Int. Cl.⁴ ........................... B32B 31/00; C09J 5/02
[52] U.S. Cl. ...................................... 156/182; 29/830;
156/307.4; 174/68.5; 428/213; 428/901
[58] Field of Search .............................. 156/307.4, 182;
428/901, 213; 29/830; 174/68.5

[56] References Cited

U.S. PATENT DOCUMENTS 4,180,608 12/1979 Del .................................... 428/901

FOREIGN PATENT DOCUMENTS 53-12082 2/1978 Japan .................................. 428/901

Primary Examiner—John J. Gallagher
Attorney, Agent, or Firm—Antonelli, Terry & Wands

[57] ABSTRACT

A method of fabricating a multilayer printed-circuit composite in which a plurality of internal layer sheets are stacked in an alternate arrangement with one another and laminated together. The relatively thin and thick internal layer sheets are stacked alternately with adhesive material sheets being interposed between the adjacent internal layer sheets. By melting the adhesive material sheets, the stacked internal layer sheets are laminated together. This structure of the multilayer printed-circuit board is effective for reducing the dimensional changes of the internal layer sheet when compared with the structure composed only of thin internal layer sheets. Thus, the multilayer printed-circuit composite can be realized in a relatively small overall thickness while reducing the dimensional changes of the individual internal layer sheets.

4 Claims, 2 Drawing Figures

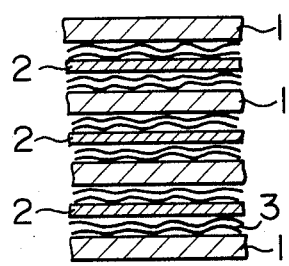
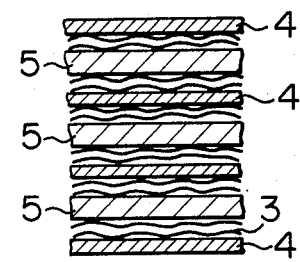

METHOD OF FABRICATING MULTILAYER PRINTED-CIRCUIT BOARD

BACKGROUND OF THE INVENTION

The present invention relates generally to a method of fabricating a multilayer printed-circuit board having a plurality of internal layers and in particular to a method of assuring stability of the internal layers in the laminate fabrication.

In view of the tendency of electronic devices being produced with a continuously increasing integration density, there arises a great demand for the realization of a multilayer printed-circuit board with a higher density for mounting of such electronic devices. To meet the demand, attempts have been made to increase the number of layers of the multilayer printed-circuit board. Increasing the number of the internal layers however involves a corresponding increasing in the overall thickness of the multilayer printed-circuit board. On the other hand, in response to the demand for the high density of interconnections among conductor patterns, approaches have been made to decrease the diameter of through-holes formed in the board, bringing about various problems such as breakage of drilling tool or bit in drilling small-diameter holes of an increased length corresponding to the increased overall thickness of the board, defects in the plating of the through-holes and poor reliability thereof. Accordingly, it is desirable to suppress an increase in the overall thickness of the multilayer printed-circuit board to as great a degree as possible. To this end, the thickness of the individual internal layer sheet as well as that of prepreg used as an adhesive sheet should desirably be as thin as possible. However, a decrease in the thickness of internal layer sheets and prepreg sheets will result in an increased deviation of dimensional changes of a specific internal layer sheet on a board-by-board basis. With the phrase "dimension of the internal layer sheet", it is intended to mean the dimension measured along the plane of the internal layer. The internal layer sheets stacked one another with prepregs interposed undergo changes in dimension in the course of the multilayering or laminating process under the influence of heat and pressure treatments. Here, with the phrase "deviation of the dimensional change", it is intended to mean the non-uniformity or dispersion of changes in dimension between predetermined layer surface locations of a specific internal layer sheet among the difference multi-layer printed-circuit boards, particularly those locations of an internal layer sheet having the signal layers which are imposed with strict dimensional tolerance requirement.

Table 1 shows, by way of example, the results of experiments conducted for determining the deviation of the dimensional changes among the internal layer sheets prior and subsequent to the laminate process by changing the thickness of the prepreg and the insulation portion of the internal layer sheet which is composed of copper-plated epoxy-glass.

TABLE 1

|  | Experiment I | Experiment II |
| --- | --- | --- |
| Thickness of insulation portion of internal layer sheet (mm) | 0.2 | 0.1 |
| Thickness of prepreg (mm) | 0.1 | 0.05 |
| Deviation of dimensional change among internal layer sheets* | 100 | 230 |

*Note:
Deviation measured in experiment I is standardized to 100

As will be seen in the Table 1, when the thickness of the insulation portion of the internal layer sheet and that of the prepreg are reduced by a half, the deviation of the dimensional change among the internal layer sheets increases by twice or more. For the reason described above, the thickness of the insulation sheet of 0.2 mm and that of the prepreg of 0.1 mm have presented practical limits in the hitherto known multilayer printed-circuit board. As the consequence, the overall thickness of the multilayer printed-circuit board has been necessarily increased in accompaniment to the increase in the number of layers. By the way, concerning the dimensional changes of the multilayer composite which occur in the lamination process is reported in an article entitled "A New Set of Printed-Circuit Technologies for the IBM 3081 Processor Unit" of IBM J. RES. DEVELOP, Vol. 26, No. 1, January, 1982.

SUMMARY OF THE INVENTION

After a series of extensive studies and experiments conducted by the inventors, it has been established that one of the major causes for the dimensional changes of the internal layer sheets in multilayer lamination is stresses induced in the internal layers due to the melting and curing of the resin impregnated in the prepreg.

More particularly, coefficients of thermal expansion of the individual sheet materials for the internal layer and prepreg were separately measured under the same temperature condition in the actual laminating process. Data of the measurements indicated that the internal layer material contracts about 0.05% of the initial dimension, while contraction of the prepreg amounts to approximately 0.1%, twice as much as that of the internal layer material. Examination is made as to the effects or influences of the dimensional change of the prepreg to the dimensional change of the internal layer sheet laminated to the former. Assuming a model in which an internal layer and a prepreg sheet are bonded to each other, let's represent the thicknesses of the internal layer sheet and the prepreg by $h_1$ and $h_2$, Young's modulis thereof by $E_1$ and $E_2$, and the amount of dimensional changes by $S_{01}$ and $S_{02}$, respectively. Then, the overall dimensional change $S_0$ of the laminated structure is given by $$S_0 = \frac{S_{01} \cdot E_1 \cdot h_1 + S_{02} \cdot E_2 \cdot h_2}{E_1 \cdot h_1 + E_2 \cdot h_2}$$

In general, the internal layer sheet and the prepreg material are of a similar structure in which resin-impregnated glass cloth is employed in both materials. Accordingly, the Young's module $E_1$ may be considered to be approximately equal to $E_2$. On the condition, the above expression may be rewritten as follows:

$$S_0 = \frac{S_{01} \cdot h_1 + S_{01} \cdot h_2}{h_1 + h_2}$$

It will be seen from the above expression that the overall dimensional change $S_0$ can be reduced by suppressing the influences of the dimensional change $S_{02}$, which in turn can be accomplished by increasing the thickness $h_1$ of the internal layer sheet material.

In the light of the result of the above examination, the inventors of the present application have found that a greater thickness of the internal layer sheet to be adhered to the prepreg is effective for restricting stress produced by the prepreg and thus, thick and thin internal layers be alternately stacked or laminated one another with thin prepreg being interposed between the thin and thick internal layers to thereby suppress to a minimum the increase in the overall thickness of the laminated composite resulting from the increasing in the number of the layers, while reducing the deviation of the dimensional changes among the thin internal layers induced in the lamination process. It is believed that by laminating the thick internal layer and the thin internal layer with the prepreg being interposed therebetween, the effect of the prepreg is suppressed mainly by the thick internal layer sheet, as a result of which deformation of the thin internal layer adjacent to the prepreg can be suppressed.

Accordingly, it is an object of the present invention to provide a method of fabricating a multilayer printed-circuit board which method allows thin internal layer sheets to be used by suppressing the deviation of the dimensional changes among the internal layer sheets brought about in the laminating process.

In view of the above object, it is proposed according to an aspect of the present invention a method of fabricating a multilayer printed-circuit board, which comprises a step of stacking alternately the internal layer sheets having relatively thick insulation portions and those having relatively thin insulation portions with layers of adhesive sheet being interposed between the adjacent internal layer sheets, and a step of laminating together the stacked internal layers by a melting adhesive sheet. In the multilayer printed-circuit board of such a structure, the dimensional changes of the individual internal layer sheets can be reduced while a relatively small overall thickness of the multilayer printed-circuit board can be assured.

BRIEF DESCRIPTION OF THE DRAWINGS

FIG. 1 is a vertical sectional view illustrating an arrangement of internal layer sheets and prepregs in a multilayer printed-circuit board according to an exemplary embodiment of the present invention; and FIG. 2 is a vertical sectional view illustrating another embodiment of the invention.

DESCRIPTION OF THE PREFERRED EMBODIMENTS

Now, the invention will be described in conjunction with the exemplary embodiments by referring to the drawings.

FIG. 1 is a vertical view showing a structure of a multilayer printed-circuit board according to an embodiment of the present invention. Referring to the figure, a reference numeral 1 denotes thick internal layer sheets each having an insulation portion of 0.2 mm in thickness, 2 denotes thin internal layer sheets each having an insulation portion of 0.1 mm in thickness, and 3 denotes prepreg each having two superposed prepreg sheets (adhesive sheets) each having a thickness of 0.05 mm. Both surfaces of the internal layer sheet 2 are formed with the plane of signal circuit patterns (signal layer), respectively, while one or both surfaces of the internal layer sheet 1 are composed of the plane or planes of power supply circuit patterns (power supply layer). As will be seen in FIG. 1, the internal layer sheets 1 and 2 are alternately stacked with the prepreg 3 being interposed between the adjacent internal layer sheets. After the internal layer sheets 1 and 2 having stacked in the manner mentioned above, the whole stack is placed under pressure and heated, whereby the prepregs 3 are molten, resulting in that the internal layer sheets 1 and 2 are laminated together to realize the aimed multilayer printed-circuit board.

FIG. 2 shows in a vertical sectional view a structure of the multilayer printed-circuit board according to another embodiment of the present invention. In the figure, a reference numeral 4 denotes thin internal layer sheets each having an insulation portion of 0.1 mm in thickness, 5 denotes thick internal layer sheets each having an insulation portion of 0.2 mm in thickness, and 3 denotes prepregs each having two superposed prepreg sheets each having a thickness of 0.05 mm. The internal layer sheet 5 has both surfaces formed with signal layer, respectively, while one or both surfaces of the internal layer sheet 4 are formed with a power supply layer or layers, by way of example. As will be seen in the figure, the internal layer sheets 4 and 5 are stacked alternately with one another with the prepregs 3 being interposed between the adjacent internal layer sheets 4 and 5. The structure of the multilayer printed-circuit board shown in FIG. 2 differs from the one shown in FIG. 1 in that the uppermost or top and bottom internal layer sheets 4 are both thin.

In the table 2, the deviations in the dimensional changes among the internal layer sheets brought about in the lamination process are listed which were obtained in the multilayer printed-circuit board composites of the structures shown in FIGS. 1 and 2, respectively, in comparison with the result of measurement obtained in a control multilayer printed-circuit board in which the thickness of the internal layer sheet is 0.2 mm thick in insulation portion, and the interposed prepreg composed of two sheets is 0.1 mm thick, wherein the deviation in the dimensional change among the internal layers is represented in ratio on the assumption that the deviation of the dimensional change in the control structure is represented by 100. Further, there are listed in the Table 2 the overall thicknesses of the multilayer printed-circuit boards.

TABLE 2

|  | Control | Structure of FIG. 1 | Structure of FIG. 2 |
| --- | --- | --- | --- |
| Insulation portions thickness of thick internal layer sheet (mm) | 0.2 | 0.2 | 0.2 |
| Insulation portions thickness of thin internal layer sheet (mm) | — | 0.1 | 0.1 |
| Prepreg thickness (mm) × Number of sheets | 0.1 × 2 | 0.05 × 2 | 0.05 × 2 |
| Overall thickness (mm) | 3.09 | 2.19 | 2.09 |
| Deviation of dimensional changes | 100 | 112 | 112 |

In all the structures employed in the measurement, the total number of layer was 14 being formed on 7 internal sheets. As will be seen from the table 2, the overall thickness of the multilayer printed-circuit board fabricated according to the teaching of the invention can be reduced to about 70% of the overall thickness of the hitherto known multilayer composite in which only the thick internal layer sheets are used. On the other hand, the deviation of the dimensional changes among the internal layer sheets is not increased to any appreciable degree in contrast to the results of the experiment II shown in the Table 1 but can be limited to only a small increment of 12% when compared with the prior art composite.

As will be appreciated from the foregoing description, the deviation of the dimensional changes among the internal layer sheets brought about in the course of laminating process can be suppressed to a significant degree according to the teaching of the present invention. Thus, the internal layer sheets of a reduced thickness can be used in realizing the multilayer printed-circuit board for the purpose of decreasing the overall thickness thereof.

What is claimed is:

1. A method of fabricating a multilayer printed-circuit board in which a plurality of internal layer sheets, are stacked and laminated together, each of the internal layer sheets having at least one circuit pattern layer and an insulation portion, comprising the steps of:

stacking a first plurality of the internal layer sheets, each having an insulation portion that is relatively thick, and a second plurality of the internal layer sheets, each having an insulation portion that is thinner than the relatively thick insulation portion of the first plurality of the internal layer sheets, alternately with one another, with an adhesive material being interposed between individual internal layer sheets, and melting said adhesive material to thereby laminate said stacked internal layer sheets together.

2. A method of fabricating a multilayer printed-circuit board according to claim 1, wherein said internal layer sheets are arranged in a stack in such an order that the stack begins with an internal layer sheet having a relatively thick insulation portion and terminates with another internal layer sheet having the same relatively thick insulation portion.

3. A method of fabricating a multilayer printed-circuit board according to claim 1, wherein said internal layer sheets are arranged in a stack in such an order that the stack begins with an internal layer sheet having a thinner insulation portion and terminates with another internal layer sheet having a thinner insulation portion of the same thickness.

4. A method of fabricating a multilayer printed-circuit board according to claim 1, wherein the thinner insulation portion of each of the second plurality of internal layer sheets has a thickness which is half of the thickness of the relatively thick insulation portion of each of the first plurality of internal layer sheets.

* * * * *